(12) United States Patent
Takano

(10) Patent No.: US 8,278,706 B2
(45) Date of Patent: Oct. 2, 2012

(54) SEMICONDUCTOR DEVICE AND METHOD OF MANUFACTURING THE SAME

(75) Inventor: Kazutoyo Takano, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 14 days.

(21) Appl. No.: 12/822,605

(22) Filed: Jun. 24, 2010

(65) Prior Publication Data

US 2011/0062514 A1    Mar. 17, 2011

(30) Foreign Application Priority Data

Sep. 16, 2009   (JP) .................................. 2009-214375

(51) Int. Cl.
*H01L 29/94* (2006.01)
(52) U.S. Cl. ........ 257/331; 257/328; 257/332; 257/140; 257/173; 257/E21.41; 438/270; 438/279
(58) Field of Classification Search .................. 257/331, 257/328, 332, 378, 140, 173, E21.41, E27.06; 438/270, 279
See application file for complete search history.

(56) References Cited

U.S. PATENT DOCUMENTS

| 6,429,501 B1 | 8/2002 | Tsuchitani et al. |
| 6,633,473 B1 * | 10/2003 | Tomomatsu ................. 361/93.7 |
| 6,717,785 B2 | 4/2004 | Fukuda et al. |
| 2004/0173845 A1 | 9/2004 | Aoki |
| 2011/0062514 A1 * | 3/2011 | Takano ........................ 257/334 |

FOREIGN PATENT DOCUMENTS

| EP | 0 669 658 B1 | 9/2005 |
| JP | 2000-323707 | 11/2000 |
| JP | 2002-314079 | 10/2002 |
| JP | 3361874 | 10/2002 |
| JP | 2005-50913 | 2/2005 |
| JP | 2007-287988 | 11/2007 |
| KR | 2002-0095110 | 12/2002 |

OTHER PUBLICATIONS

Office Action issued Mar. 27, 2012 in Korean Application No. 10-2010-0079592 (w/English translation).
Office Action issued Apr. 24, 2012 in German Application No. 10 2010 040 842.5 (w/English Translation).

* cited by examiner

*Primary Examiner* — Jack Chen
(74) *Attorney, Agent, or Firm* — Oblon, Spivak, McClelland, Maier & Neustadt, L.L.P.

(57) ABSTRACT

A first semiconductor element portion for switching a first current includes a first channel surface having a first plane orientation. A first region of a semiconductor layer includes a first trench having the first channel surface. A first gate insulating film covers the first channel surface with a first thickness. A second semiconductor element portion for switching a second current smaller than the first current includes a second channel surface having a second plane orientation different from the first plane orientation. A second region of the semiconductor layer includes a second trench having the second channel surface. A second gate insulating film covers the second channel surface with a second thickness larger than the first thickness.

7 Claims, 16 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly to a semiconductor device having a gate electrode formed to fill a trench and a method of manufacturing the same.

2. Description of the Background Art

There are semiconductor devices including a main electrode for supplying a current to be switched, i.e., a main current, to a semiconductor layer, and a gate electrode for applying an electric field to the semiconductor layer, and performing switching by controlling a channel of the semiconductor layer with the electric field generated by the gate electrode. A MOS (Metal Oxide Semiconductor) transistor or an IGBT (Insulated Gate Bipolar Transistor) are representative examples of such semiconductor devices. Particularly in power control applications, a structure in which a number of cells each capable of performing switching operation are connected in parallel is common.

Some of such semiconductor devices including a number of cells have a function of monitoring a main current in order to check whether it is excessive or not. According to Japanese Patent No. 3361874, for example, a semiconductor device includes a number of main IGBT cells for switching a main current, as well as sense IGBT cells for switching a smaller sense current corresponding to the main current, and monitors the main current in order to check whether it is excessive or not by detecting the sense current.

It is known that a surge may occur in the sense current during turn-on. The reason why the surge occurs may be because sense IGBT cells turn on earlier than main IGBT cells due to a slight structural difference or manufacturing variations between the main IGBT cells and the sense IGBT cells, and a current that flows as a result thereof flows through the sense IGBT cells considerably smaller in number than the main IGBT cells. When a surge occurs in the sense current, a main current is erroneously recognized as being excessive, which results in unnecessary operation for protecting the semiconductor device against overcurrent.

In order to delay turn-on of the sense IGBT cells, therefore, according to the technique in Japanese Patent No. 3361874 described above, a voltage threshold value of the sense IGBT cells is set higher than a voltage threshold value of the main IGBT cells.

SUMMARY OF THE INVENTION

According to the technique in the publication described above, however, in order to obtain a structure in which the voltage threshold value of the sense IGBT cells is higher than the voltage threshold value of the main IGBT cells, a manufacturing process of the semiconductor device becomes complicated, for example, the number of times of photolithography steps performed is increased.

The present invention was made in view of the problems described above, and an object of the present invention is to provide a semiconductor device capable of achieving suppressed complexity of a manufacturing process while suppressing a surge in a sense current, and a method of manufacturing the same.

A semiconductor device according to the present invention includes a semiconductor layer having a single-crystalline structure, and includes a first semiconductor element portion and a second semiconductor element portion. The first semiconductor element portion for switching a first current includes a first channel surface having a first plane orientation. The first semiconductor element portion includes a first region of the semiconductor layer, a first gate insulating film, and a first gate electrode. The first region of the semiconductor layer includes a first trench having the first channel surface. The first gate insulating film covers the first channel surface with a first thickness. The first gate electrode is provided on the first gate insulating film to fill the first trench, for applying an electric field to the first channel surface. The second semiconductor element portion for switching a second current smaller than the first current includes a second channel surface having a second plane orientation different from the first plane orientation. The second semiconductor element portion includes a second region of the semiconductor layer, a second gate insulating film, and a second gate electrode. The second region of the semiconductor layer includes a second trench having the second channel surface. The second gate insulating film covers the second channel surface with a second thickness larger than the first thickness. The second gate electrode for applying an electric field to the second channel surface is provided on the second gate insulating film to fill the second trench.

A method of manufacturing a semiconductor device including a first semiconductor element portion having a first channel surface for switching a first current and a second semiconductor element portion having a second channel surface for switching a second current smaller than the first current according to the present invention includes the following steps.

First, a semiconductor layer having a single-crystalline structure is prepared. First and second trenches penetrating the semiconductor layer are formed such that the first and second channel surfaces are formed, respectively. The first channel surface has a first plane orientation, and the second channel surface has a second plane orientation different from the first plane orientation. First and second gate insulating films covering the first and second channel surfaces, respectively, are formed by chemical combination reaction on the first and second channel surfaces. A first gate electrode is formed on the first gate insulating film to fill the first trench, and a second gate electrode is formed on the second gate insulating film to fill the second trench. In the step of forming the first and second trenches, the first and second plane orientations are selected such that a rate of progress of the chemical combination reaction in the second plane orientation of the semiconductor layer is faster than a rate of progress of the chemical combination reaction in the first plane orientation of the semiconductor layer.

According to the present invention, the thickness of the second gate insulating film is made larger than the thickness of the first gate insulating film, so that the voltage threshold value of the second semiconductor element portion is higher than the voltage threshold value of the first semiconductor element portion. Accordingly, turn-on of the second semiconductor element portion can be delayed as compared to turn-on of the first semiconductor element portion, thereby preventing current concentration in the second semiconductor element portion configured for switching a small current used as a sense current. Therefore, a surge in the sense current caused by the current concentration can be suppressed.

Further, as described above, the first and second gate insulating films different from each other in thickness can be simultaneously formed by utilizing the difference in rate of progress of chemical combination reaction depending on plane orientation. As a result, increase in complexity of a manufacturing process of the semiconductor device can be suppressed as compared to an example where the first and second gate insulating films are separately formed.

As described above, according to the present invention, increase in complexity of the manufacturing process can be suppressed while suppressing a surge in the sense current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

(First Embodiment)

Figure 1:
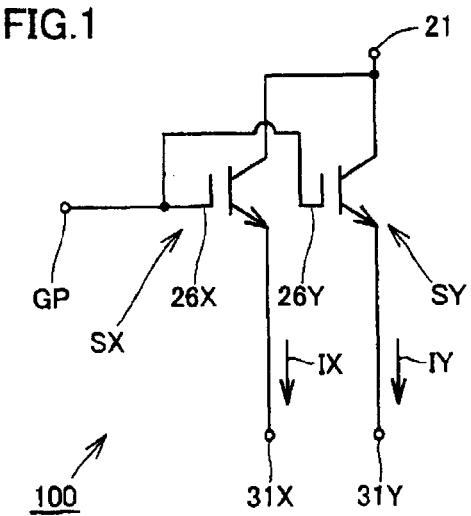
FIG. 1 is a circuit diagram schematically showing a configuration of a semiconductor device according to a first embodiment of the present invention.

Referring to FIG. 1, a semiconductor device 100 in the present embodiment is a power semiconductor device, and includes a main portion SX (first semiconductor element portion), a sense portion SY (second semiconductor element portion), and a gate pad GP. Main portion SX and sense portion SY are IGBT portions for switching a main current IX (first current) and a sense current IY (second current), respectively, in accordance with a voltage of gate pad GP. An absolute value of sense current IY is smaller than an absolute value of main current IX, e.g., about one-thousandth of the absolute value of main current IX, and a waveform of sense current IY substantially corresponds to a waveform of main current IX. Thus, sense current IY can be used as a current for monitoring a value of main current IX in order to check whether it is excessive or not.

Main portion SX includes a main gate electrode 26X as its gate electrode, a main emitter electrode 31X as its emitter electrode, and a collector electrode 21. Sense portion SY includes a sense gate electrode 26Y as its gate electrode, a sense emitter electrode 31Y as its emitter electrode, and collector electrode 21. Collector electrode 21 is shared between main portion SX and sense portion SY. Main gate electrode 26X and sense gate electrode 26Y are both electrically connected to gate pad GP.

Next, a configuration of semiconductor device 100 is described in detail.

Figure 2:
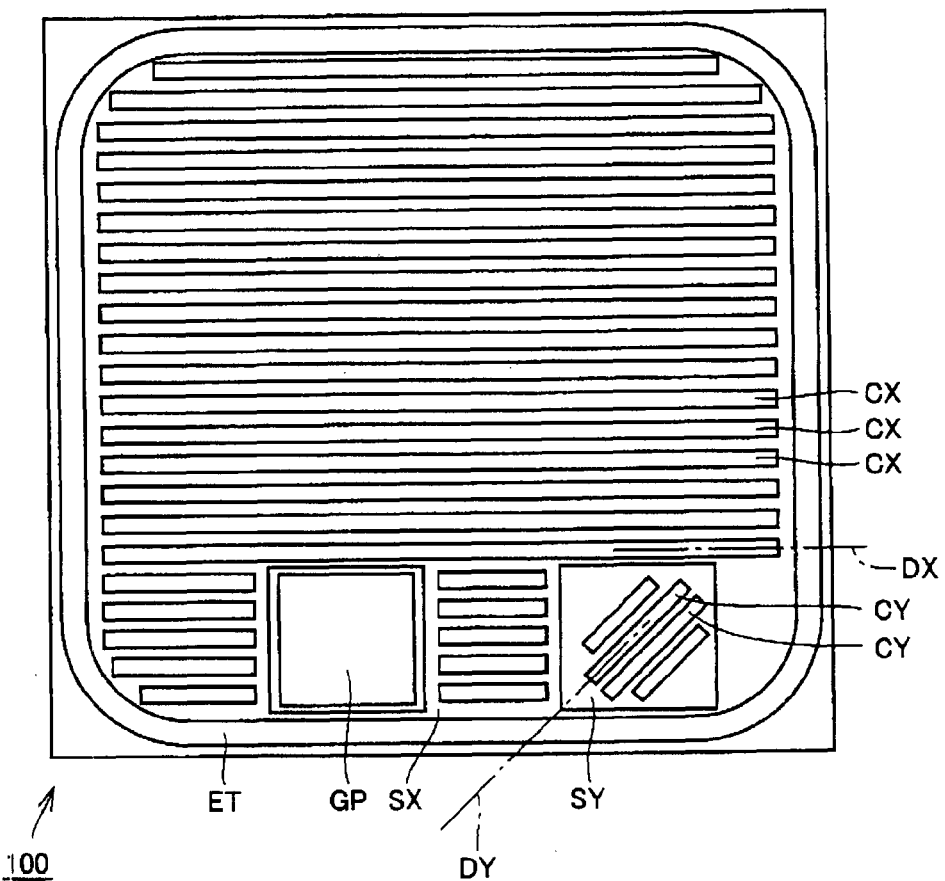
FIG. 2 is a plan view schematically showing the configuration of the semiconductor device according to the first embodiment of the present invention.
Figure 5:
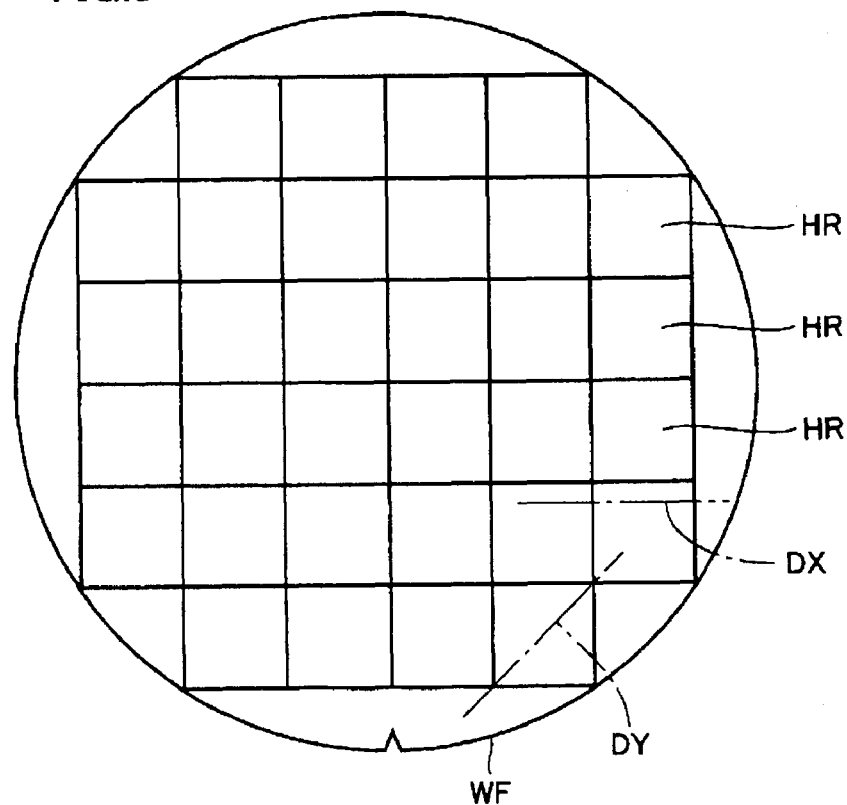
FIG. 5 is a plan view schematically showing a step in a method of manufacturing the semiconductor device according to the first embodiment of the present invention.

Referring mainly to FIG. 2, semiconductor device 100 includes main portion SX and sense portion SY as described above, which are formed by processing one single-crystalline silicon wafer WF (single-crystalline substrate: FIG. 5) with the use of a semiconductor manufacturing technique. More specifically, each of a plurality of chip regions HR (FIG. 5) of single-crystalline silicon wafer WF is processed, and upon completion of processing at wafer level, each of chip regions HR is cut by dicing, thus obtaining semiconductor device 100.

Main portion SX includes a plurality of main cells CX, and sense portion SY includes a plurality of sense cells CY. Each of main cells CX and sense cells CY is a portion structure having a function as an IGBT element, i.e., a switching element. The plurality of main cells CX are arranged in main portion SX, and the plurality of sense cells CY are arranged in sense portion SY. The number of sense cells CY being provided is smaller than the number of main cells CX since sense current IY (FIG. 1) is smaller than main current IX, e.g., about one-thousandth of the number of main cells CX.

Main cells CX and sense cells CY extend along a main direction DX (first direction) and a sense direction DY (second direction), respectively, when viewed two-dimensionally. Main direction DX and sense direction DY are directions different from each other, and crystallographically, main direction DX is a direction of a normal of a (001) plane orientation and sense direction DY is a direction of a normal of a (011) plane orientation in the present embodiment.

As will be described later in detail, a gate insulating film of sense cell CY has a thickness larger than a thickness of a gate insulating film of main cell CX. Accordingly, a voltage threshold value of sense cell CY is higher than a voltage threshold value of main cell CX.

Semiconductor device 100 further includes an edge termination portion ET. Edge termination portion ET is provided on the outer periphery of semiconductor device 100 when viewed two-dimensionally, and has a function of ensuring a withstand voltage. For instance, a guard ring structure is provided in edge termination portion ET.

Figure 3:
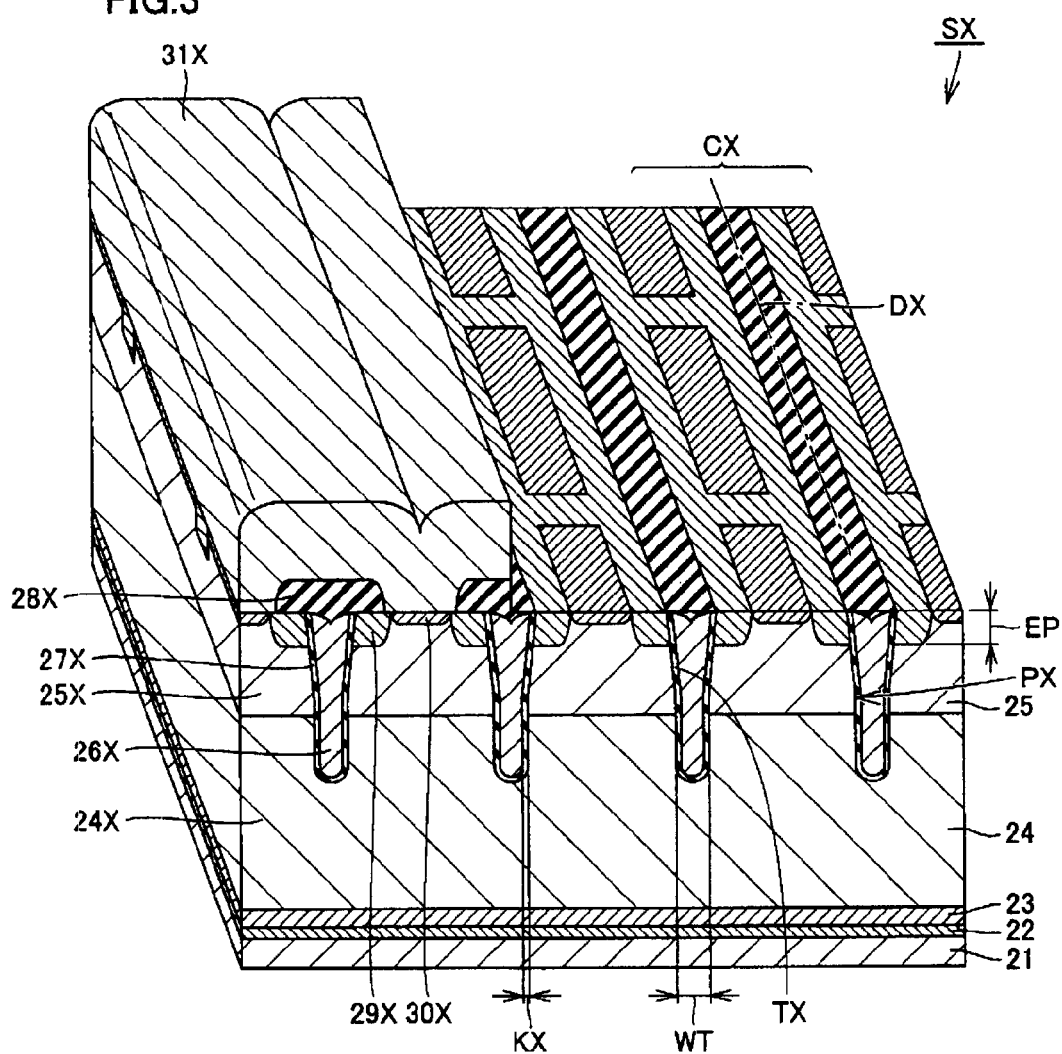
FIG. 3 is a partial cross-sectional perspective view schematically showing a configuration of a main current control portion as a first semiconductor element portion in the semiconductor device shown in FIG. 2.
Figure 4:
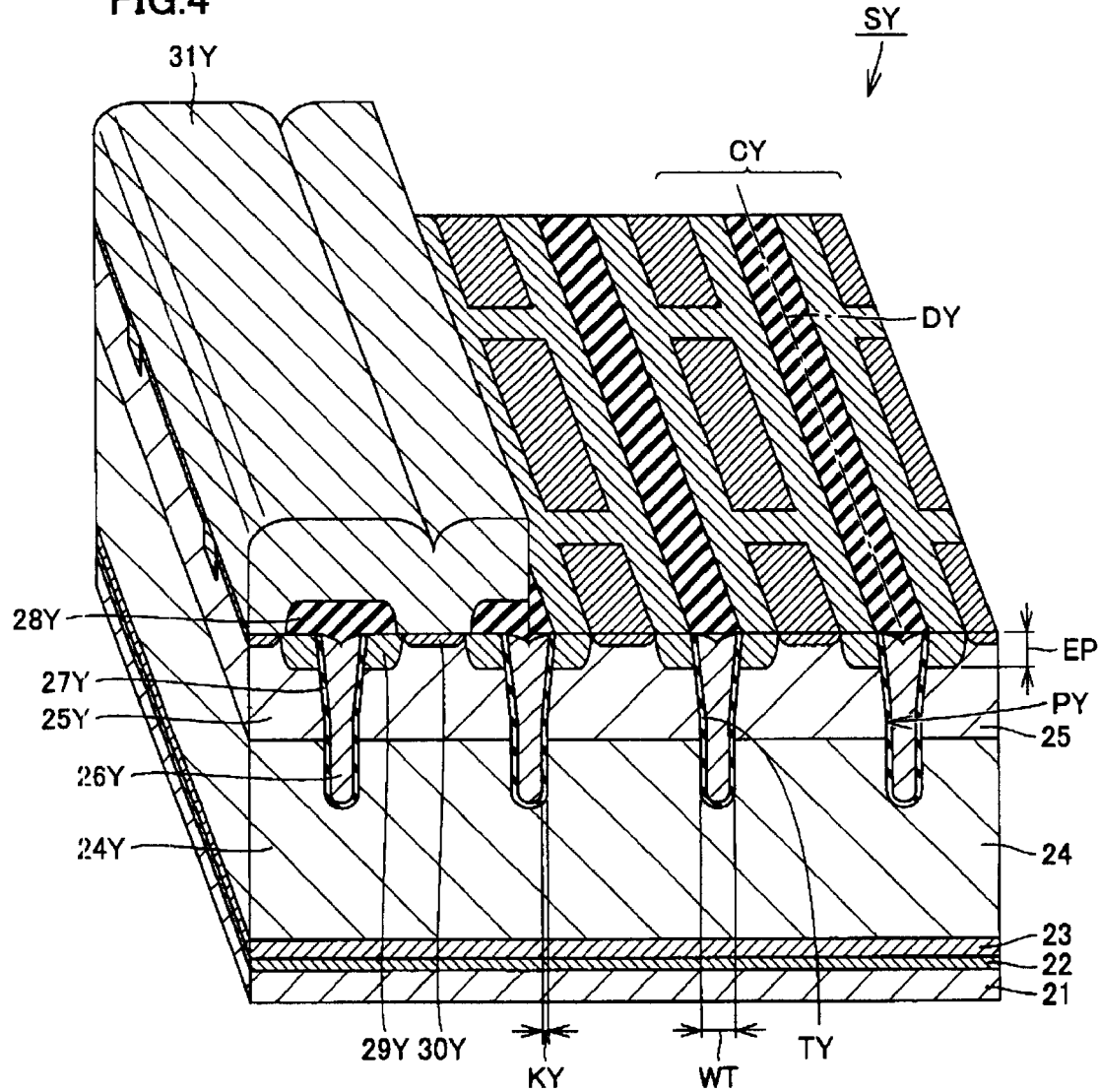
FIG. 4 is a partial cross-sectional perspective view schematically showing a configuration of a sense current control portion as a second semiconductor element portion in the semiconductor device shown in FIG. 2.

Referring to FIGS. 3 and 4, semiconductor device 100 includes a stacked film having collector electrode 21, a p collector layer 22, an n buffer layer 23, an n$^-$ drift layer 24, and a p base layer 25 (semiconductor layer) stacked successively across main portion SX and sense portion SY. In the present embodiment, p collector layer 22 and p base layer 25 are p-type layers, and n buffer layer 23 and n$^-$ drift layer 24 are n-type layers. P base layer 25 has a single-crystalline structure, and is specifically made of single-crystalline silicon. A layer formed from single-crystalline silicon wafer WF described above, or a layer formed by epitaxial growth on single-crystalline silicon wafer WF may be used as p base layer 25 having the single-crystalline structure.

In the following description, portions of n$^-$ drift layer 24 and p base layer 25 included in main portion SX are denoted as a main n$^-$ drift layer 24X and a main p base layer 25X (first region), and portions of n$^-$ drift layer 24 and p base layer 25 included in sense portion SY are denoted as a sense n$^-$ drift layer 24Y and a sense p base layer 25Y (second region).

Referring to FIG. 3, main portion SX includes collector electrode 21, p collector layer 22, n buffer layer 23, main n$^-$ drift layer 24X, and main p base layer 25X as described above, and for each main cell CX, includes a main gate insulating film 27X (first gate insulating film), main gate electrode 26X, a main n$^+$ source portion 29X (first source portion), and a main p$^+$ contact portion 30X.

Main n$^+$ source portion 29X is formed in main p base layer 25X to a first depth EP, to form a ladder-like shape when viewed two-dimensionally. Main p$^+$ contact portion 30X is formed in main p base layer 25X to occupy the inside of this ladder-like shape.

In the stacked film including main n$^-$ drift layer 24X and main p base layer 25X, a main trench TX being in contact with main n$^+$ source portion 29X and penetrating main p base layer 25X to reach main n$^-$ drift layer 24X is formed. Main trench TX has a trench width WT and extends in main direction DX when viewed two-dimensionally.

Main gate insulating film 27X is formed to cover an inner surface of main trench TX with a first thickness KX. Main gate insulating film 27X is made of a material obtained by oxidation reaction of a material for p base layer 25, i.e., silicon. Namely, main gate insulating film 27X is made of silicon oxide. Main gate insulating film 27X is a silicon oxide film having a thickness of 100 nm, for example.

Main gate electrode 26X is provided on main gate insulating film 27X to fill main trench TX. Thus, like main trench TX, main gate electrode 26X also extends in main direction DX when viewed two-dimensionally.

With the configuration described above, main trench TX includes a main channel surface PX (first channel surface) facing main gate electrode 26X with main gate insulating film 27X interposed therebetween, in a portion penetrating main p base layer 25X. Main channel surface PX is formed by main p base layer 25X, and lies between main n$^-$ drift layer 24X and main n$^+$ source portion 29X. An electric field is applied to main channel surface PX from main gate electrode 26X through main gate insulating film 27X. Thus, main channel surface PX functions as an n channel in a MOS structure controlled by main gate electrode 26X. A plane orientation of main channel surface PX (first plane orientation) is perpendicular to a direction of a thickness of semiconductor device 100 and main direction DX, and is specifically the (001) plane orientation.

Main portion SX further includes a main interlayer insulating film 28X and main emitter electrode 31X. Main emitter electrode 31X is provided to be in contact with main n$^+$ source portion 29X and main p$^+$ contact portion 30X. Main interlayer insulating film 28X is provided to isolate main emitter electrode 31X and main gate electrode 26X from each other.

Referring to FIG. 4, sense portion SY includes a configuration substantially the same as that of main portion SX described above, except for an orientation of its arrangement and a thickness of a gate insulating film. A specific configuration of sense portion SY is described hereinafter.

Sense portion SY includes collector electrode 21, p collector layer 22, n buffer layer 23, sense n$^-$ drift layer 24Y, and sense p base layer 25Y as described above, and for each sense cell CY, includes a sense gate insulating film 27Y (second gate insulating film), sense gate electrode 26Y, a sense n$^+$ source portion 29Y (second source portion), and a sense p$^+$ contact portion 30Y.

Sense n$^+$ source portion 29Y is formed in sense p base layer 25Y to first depth EP, to form a ladder-like shape when viewed two-dimensionally. Sense p$^+$ contact portion 30Y is formed in sense p base layer 25Y to occupy the inside of this ladder-like shape.

In the stacked film including sense n$^-$ drift layer 24Y and sense p base layer 25Y, a sense trench TY being in contact with sense n$^+$ source portion 29Y and penetrating sense p base layer 25Y to reach sense n$^-$ drift layer 24Y is formed. Sense trench TY has trench width WT and extends in sense direction DY when viewed two-dimensionally.

Sense gate insulating film 27Y is formed to cover an inner surface of sense trench TY with a second thickness KY. Sense gate insulating film 27Y is made of a material obtained by oxidation reaction of the material for p base layer 25, i.e., silicon. Namely, sense gate insulating film 27Y is made of silicon oxide. Second thickness KY is larger than first thickness KX (FIG. 3) of main gate insulating film 27X. For example, if main gate insulating film 27X is a silicon oxide film having a thickness of 100 nm, sense gate insulating film 27Y is a silicon oxide film having a thickness of 140 nm.

Sense gate electrode 26Y is provided on sense gate insulating film 27Y to fill sense trench TY. Thus, like sense trench TY, sense gate electrode 26Y also extends in sense direction DY when viewed two-dimensionally.

With the configuration described above, sense trench TY includes a sense channel surface PY (second channel surface) facing sense gate electrode 26Y with sense gate insulating film 27Y interposed therebetween, in a portion penetrating sense p base layer 25Y. Sense channel surface PY is formed by sense p base layer 25Y, and lies between sense n$^-$ drift layer 24Y and sense n$^+$ source portion 29Y. An electric field is applied to sense channel surface PY from sense gate electrode 26Y through sense gate insulating film 27Y. Thus, sense channel surface PY functions as an n channel in a MOS structure controlled by sense gate electrode 26Y. A plane orientation of sense channel surface PY (second plane orientation) is perpendicular to the direction of the thickness of semiconductor device 100 and sense direction DY, and is specifically the (011) plane orientation.

The material for p base layer 25 has such a property that a rate of progress of oxidation reaction in the (011) plane orientation of sense channel surface PY is faster than a rate of progress of oxidation reaction in the (001) plane orientation of main channel surface PX. That is, the single-crystalline silicon has such a property that a rate of progress of oxidation reaction in the (011) plane orientation is faster than a rate of progress of oxidation reaction in the (001) plane orientation.

Sense portion SY further includes a sense interlayer insulating film 28Y and sense emitter electrode 31Y. Sense emitter electrode 31Y is provided to be in contact with sense n$^+$ source portion 29Y and sense p$^+$ contact portion 30Y. Sense interlayer insulating film 28Y is provided to isolate sense emitter electrode 31Y and sense gate electrode 26Y from each other.

With the configuration described above, a voltage threshold value of sense portion SY is higher than a voltage threshold value of main portion SX. The reason therefor is described below.

A voltage threshold value is represented by the following expression (1):

$$V_{th} = \sqrt{\frac{4 \cdot \varepsilon_0 \cdot N_a \cdot \phi_F \cdot \varepsilon_{Si}}{\varepsilon_{ox}^2}} \cdot t_{ox} + 2\phi_F \quad (1)$$

where $V_{th}$ indicates a voltage threshold value, $\varepsilon_0$ indicates a dielectric constant under vacuum, $N_a$ indicates a concentration of a conductivity type impurity in a channel, $\phi_F$ indicates a surface potential, $\varepsilon_{Si}$ indicates a dielectric constant in silicon, $\varepsilon_{ox}$ indicates a dielectric constant of silicon oxide, and $t_{ox}$ indicates a thickness of a gate oxide film.

Figure 6:
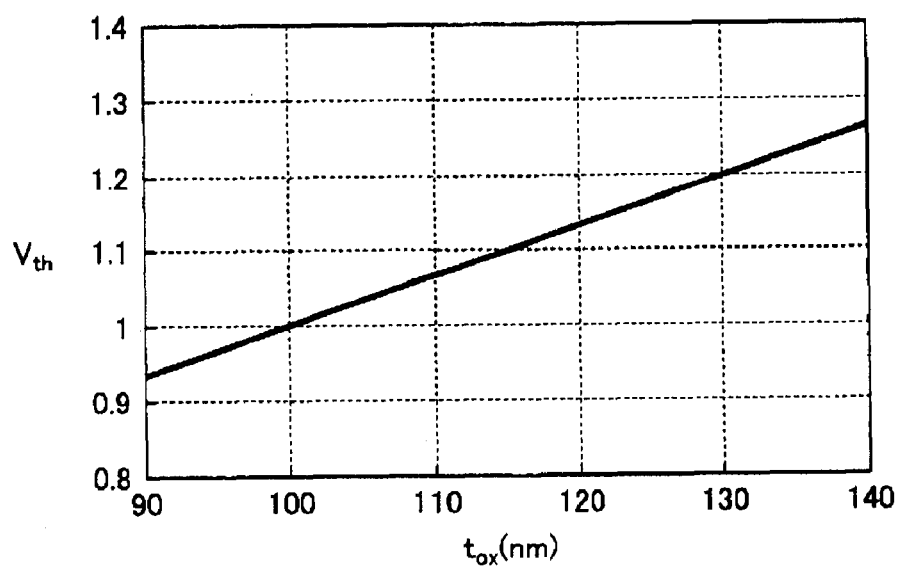
FIG. 6 is a graph illustrating an exemplary relation between a gate oxide film and a voltage threshold value.

It can be seen from the expression (1) that voltage threshold value $V_{th}$ increases as thickness $t_{ox}$ of the gate oxide film increases. In the present embodiment, second thickness KY of sense gate insulating film 27Y made of silicon oxide is larger than first thickness KX of main gate insulating film 27X made of silicon oxide. Accordingly, the voltage threshold value of sense portion SY including sense gate insulating film 27Y is higher than the voltage threshold value of main portion SX including main gate insulating film 27X. This fact was also supported by experimental results shown in FIG. 6.

Next, a method of manufacturing semiconductor device 100 is described.

Figure 16:
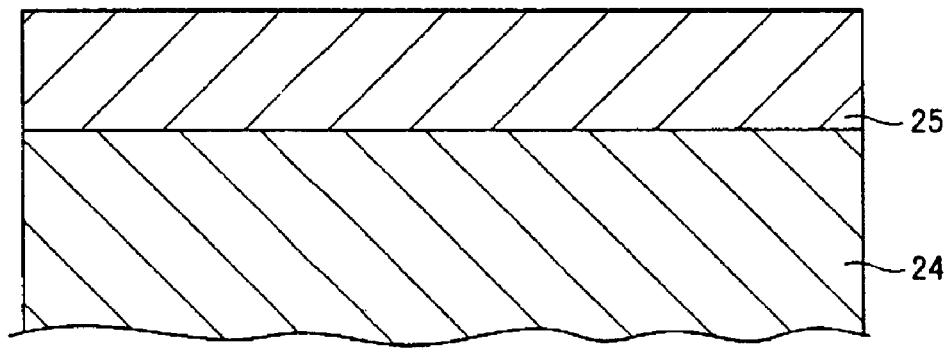
FIG. 16 is a partial cross-sectional view schematically showing a first step of a method of manufacturing the semiconductor device according to the first embodiment of the present invention.

Referring to FIG. 16, a stacked structure including n$^-$ drift layer 24 and p base layer 25 is prepared by using single-crystalline silicon wafer WF (FIG. 5).

Figure 17A:
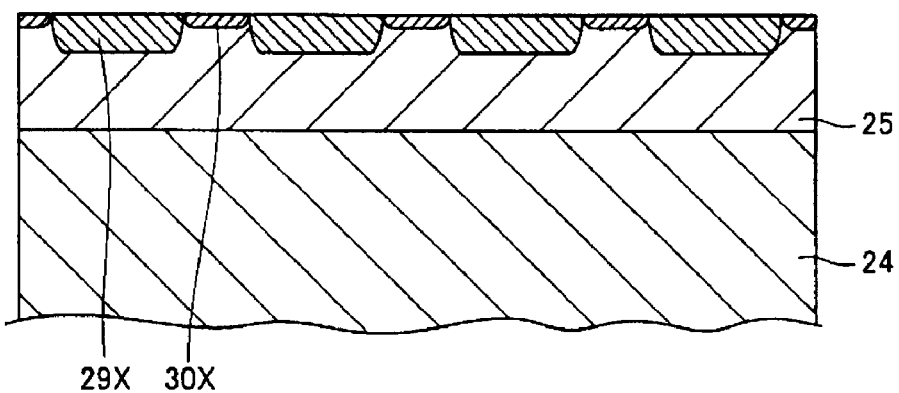
FIG. 17A is a partial cross-sectional view schematically showing a second step of the method of manufacturing the semiconductor device according to the first embodiment of the present invention, showing a region to be the first semiconductor element portion.
Figure 17B:
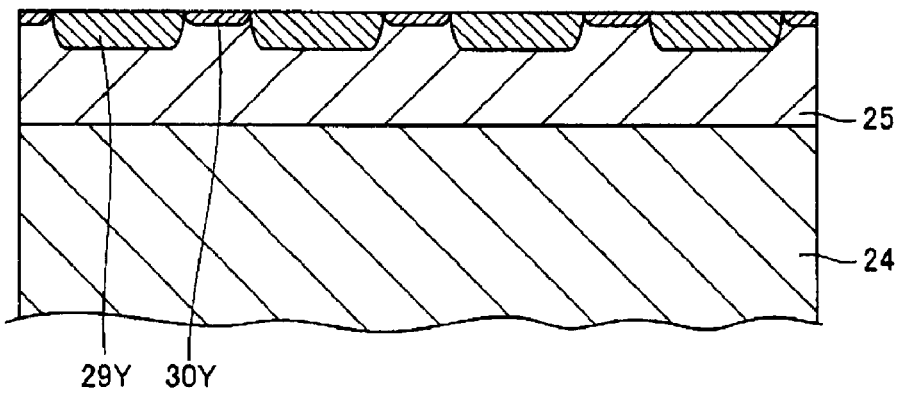
FIG. 17B is a partial cross-sectional view schematically showing a second step of the method of manufacturing the semiconductor device according to the first embodiment of the present invention, showing a region to be the second semiconductor element portion.

Referring to FIGS. 17A and 17B, main n$^+$ source portion 29X and main p$^+$ contact portion 30X and sense n$^+$ source portion 29Y and sense p$^+$ contact portion 30Y are formed in p base layer 25 with an ion implantation technique. In forming these portions, for example, main direction DX (FIG. 3) extends along a direction of one side of chip region HR (FIG. 5) in a rectangular shape, and sense direction DY (FIG. 4) is oblique to each side of this chip region HR.

Figure 18A:
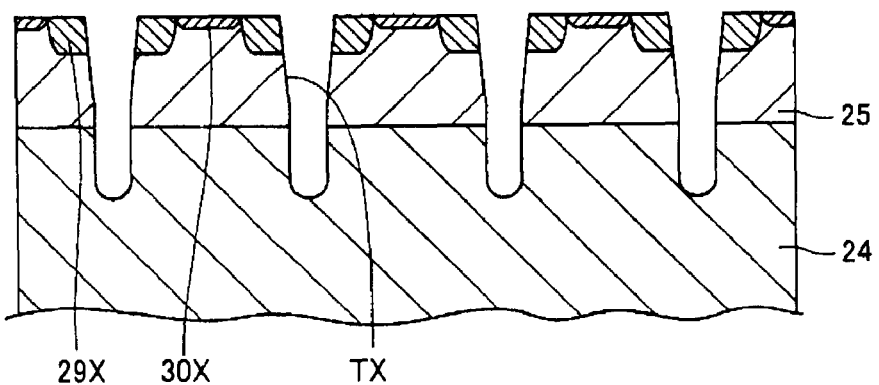
FIG. 18A is a partial cross-sectional view schematically showing a third step of the method of manufacturing the semiconductor device according to the first embodiment of the present invention, showing a region to be the first semiconductor element portion.
Figure 18B:
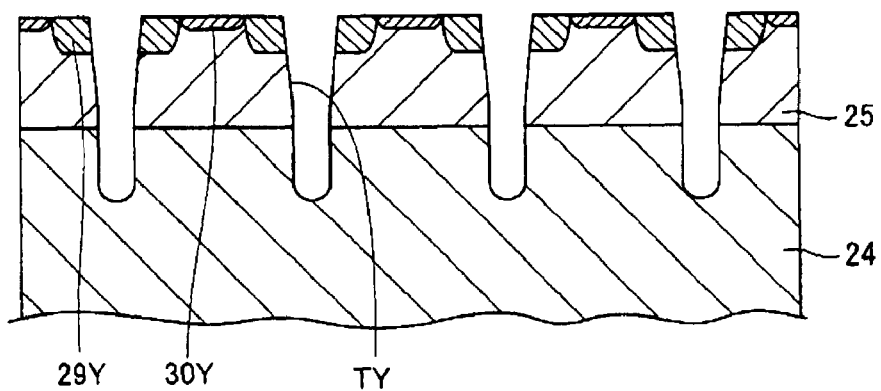
FIG. 18B is a partial cross-sectional view schematically showing a third step of the method of manufacturing the semiconductor device according to the first embodiment of the present invention, showing a region to be the second semiconductor element portion.

Referring to FIGS. 18A and 18B, main trench TX and sense trench TY penetrating p base layer 25 are formed such that main channel surface PX (FIG. 3) and sense channel surface PY (FIG. 4) are formed, respectively. The first and second plane orientations of main channel surface PX and sense channel surface PY, respectively, are selected such that a rate of progress of oxidation reaction in the second plane orientation of p base layer 25 is faster than a rate of progress of oxidation reaction in the first plane orientation.

Figure 19A:
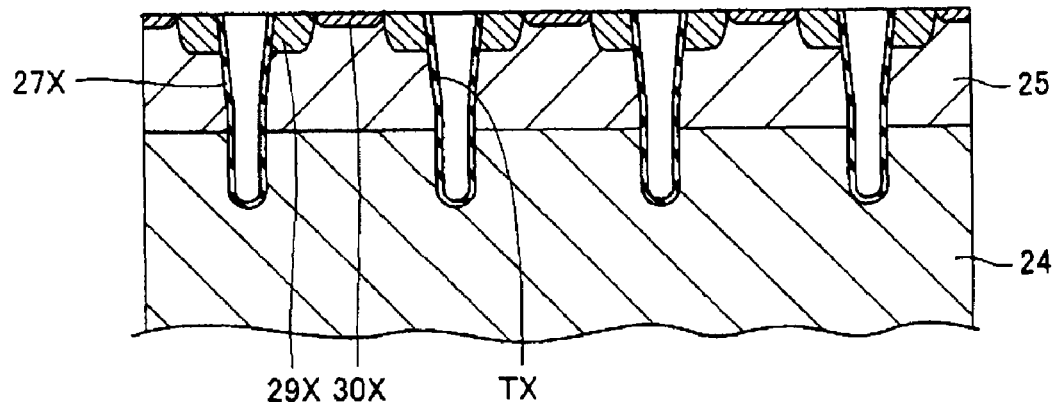
FIG. 19A is a partial cross-sectional view schematically showing a forth step of the method of manufacturing the semiconductor device according to the first embodiment of the present invention, showing a region to be the first semiconductor element portion.
Figure 19B:
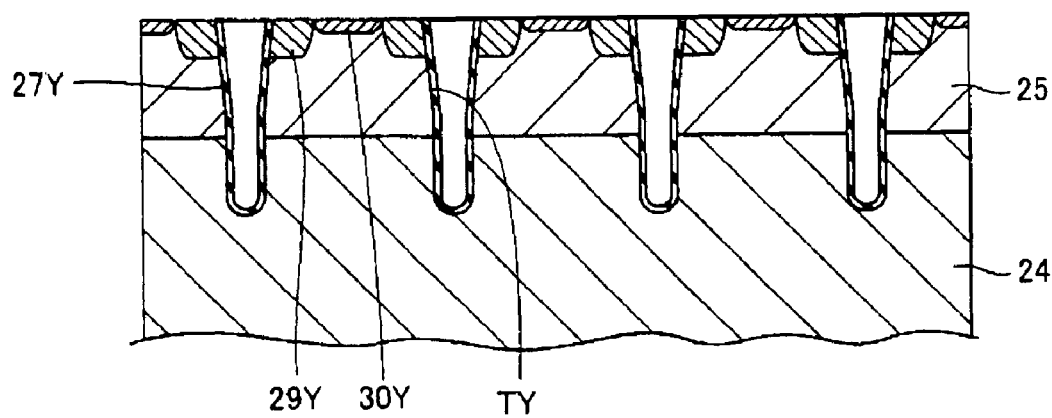
FIG. 19B is a partial cross-sectional view schematically showing a forth step of the method of manufacturing the semiconductor device according to the first embodiment of the present invention, showing a region to be the second semiconductor element portion.

Referring to FIGS. 19A and 19B, surfaces of main trench TX and sense trench TY are simultaneously oxidized, for example, by thermal oxidation. Thus, oxidation reaction on main channel surface PX (FIG. 3) and sense channel surface PY (FIG. 4) leads to formation of main gate insulating film 27X and sense gate insulating film 27Y covering main channel surface PX and sense channel surface PY, respectively. Specifically, a silicon oxide film having a thickness of 100 nm is formed on main channel surface PX having the (001) plane orientation, and a silicon oxide film having a thickness of 140 nm is formed on sense channel surface PY having the (011) plane orientation. The difference in thickness occurs since the rate of oxidation of single-crystalline silicon depends on plane orientation.

Figure 20A:
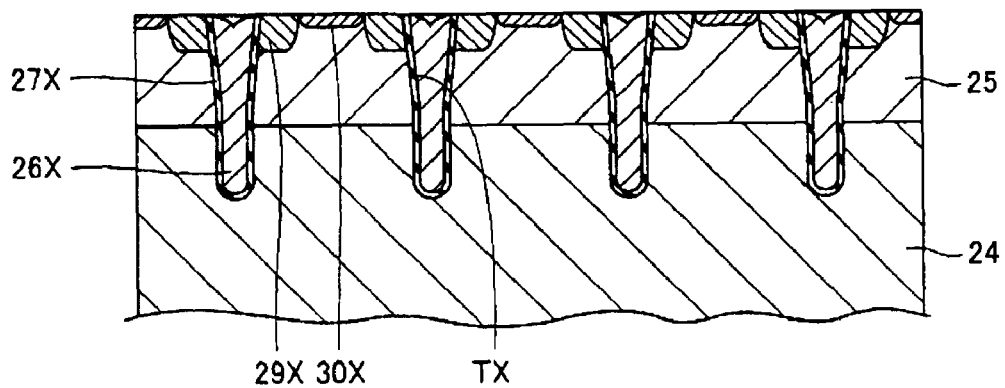
FIG. 20A is a partial cross-sectional view schematically showing a fifth step of the method of manufacturing the semiconductor device according to the first embodiment of the present invention, showing a region to be the first semiconductor element portion.
Figure 20B:
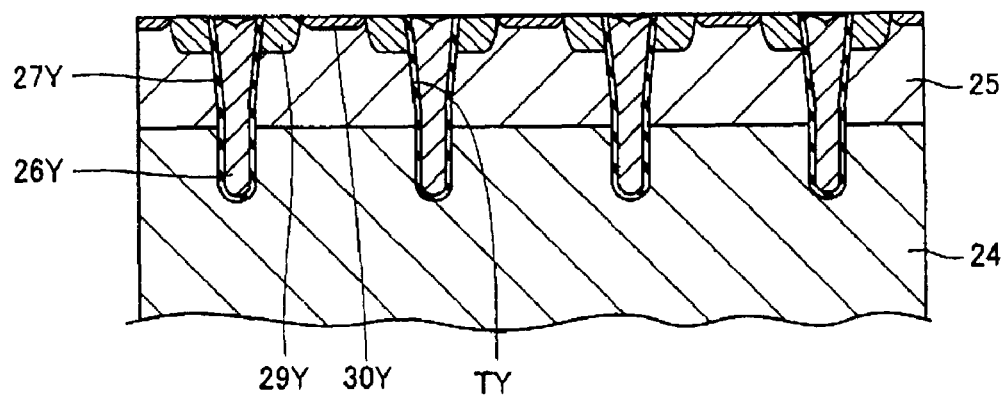
FIG. 20B is a partial cross-sectional view schematically showing a fifth step of the method of manufacturing the semiconductor device according to the first embodiment of the present invention, showing a region to be the second semiconductor element portion.

Referring to FIGS. 20A and 20B, main gate electrode 26X is formed on main gate insulating film 27X to fill main trench TX, and sense gate electrode 26Y is formed on sense gate insulating film 27Y to fill sense trench TY. Other necessary steps are subsequently performed, thus obtaining semiconductor device 100.

According to the present embodiment, thickness KY (second thickness) of sense gate insulating film 27Y (FIG. 4) is made larger than thickness KX (first thickness) of main gate insulating film 27X (FIG. 3). Thus, the voltage threshold value of sense portion SY is higher than the voltage threshold value of main portion SX. Accordingly, turn-on of sense portion SY can be delayed as compared to turn-on of main portion SX, thereby preventing current concentration in sense portion SY configured for switching a small current used as sense current IY (FIG. 1). Therefore, a surge, in sense current IY caused by current concentration can be suppressed.

Further, as described above, main gate insulating film 27X and sense gate insulating film 27Y different from each other in thickness can be simultaneously formed without the need to add a photomask, by utilizing the difference in rate of progress of oxidation reaction depending on plane orientation. As a result, increase in complexity of a manufacturing process of semiconductor device 100 can be suppressed as compared to an example where main gate insulating film 27X and sense gate insulating film 27Y different from each other in thickness are separately formed.

As described above, according to the present embodiment, increase in complexity of the manufacturing process of semiconductor device 100 can be suppressed while a surge in sense current IY (FIG. 1) is suppressed.

Since a surge is suppressed as described above, erroneous recognition of increase in sense current IY at the time when main current IX (FIG. 1) becomes excessive as a mere surge in sense current IY is prevented. This allows more reliable protection of semiconductor device 100 when main current IX becomes excessive, thereby extending life of semiconductor device 100.

Moreover, since increase in complexity of the manufacturing process of semiconductor device 100 can be suppressed as described above, a manufacturing yield of semiconductor device 100 can be improved.

Although oxidation reaction was used in order to form main gate insulating film 27X and sense gate insulating film 27Y in the above description, chemical combination reaction other than oxidation reaction, e.g., nitridation reaction, may be used for this purpose. In this case, the main gate insulating film and the sense gate insulating film are nitride films.

(Second Embodiment)

Figure 7:
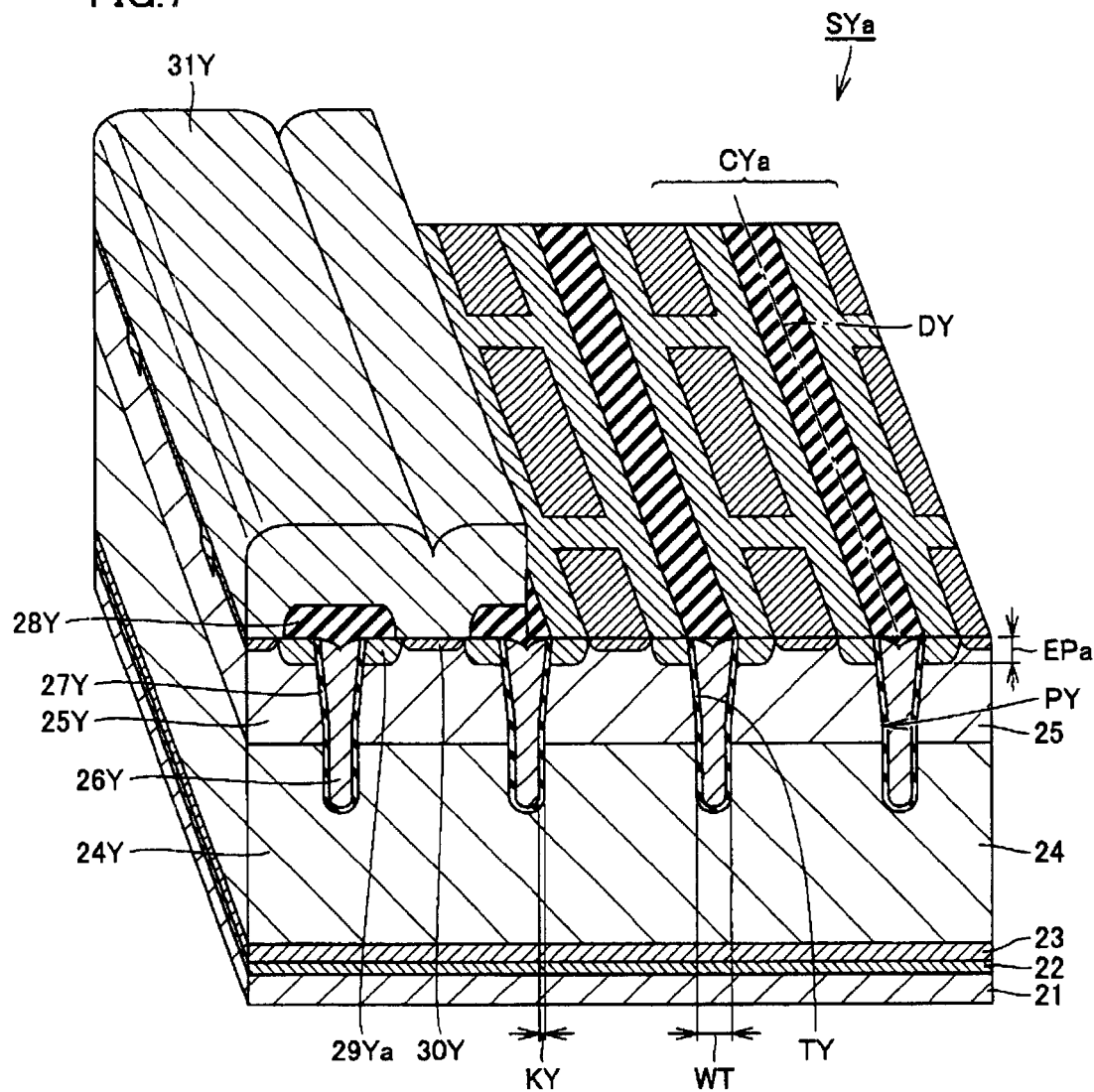
FIG. 7 is a partial cross-sectional perspective view schematically showing a configuration of a sense current control portion as a second semiconductor element portion in a semiconductor device according to a second embodiment of the present invention.

Referring mainly to FIG. 7, a semiconductor device according to the present embodiment includes a sense portion SYa instead of sense portion SY (FIG. 4) in the first embodiment. Sense portion SYa includes a sense cell CYa arranged similarly to sense cell CY (FIG. 4).

Sense portion SYa also includes, instead of sense n+ source portion 29Y of sense portion SY (FIG. 4), a sense n+ source portion 29Ya having a depth EPa different from depth EP of sense n+ source portion 29Y for each sense cell CYa. With this configuration, depth EP (FIG. 3) of main n+ source portion 29X (first source portion) of main portion SX and depth EPa (FIG. 7) of sense n+ source portion 29Ya (second source portion) of sense portion SYa in the semiconductor device according to the present embodiment are different from each other.

The configuration is otherwise substantially the same as in the first embodiment described above, and thus the same or corresponding elements have the same characters and description thereof will not be repeated.

Next, a method of manufacturing the semiconductor device according to the present embodiment is described.

First, a stacked structure including n− drift layer 24 and p base layer 25 (FIGS. 3 and 7) is prepared by using single-crystalline silicon wafer WF (FIG. 5).

Figure 8:
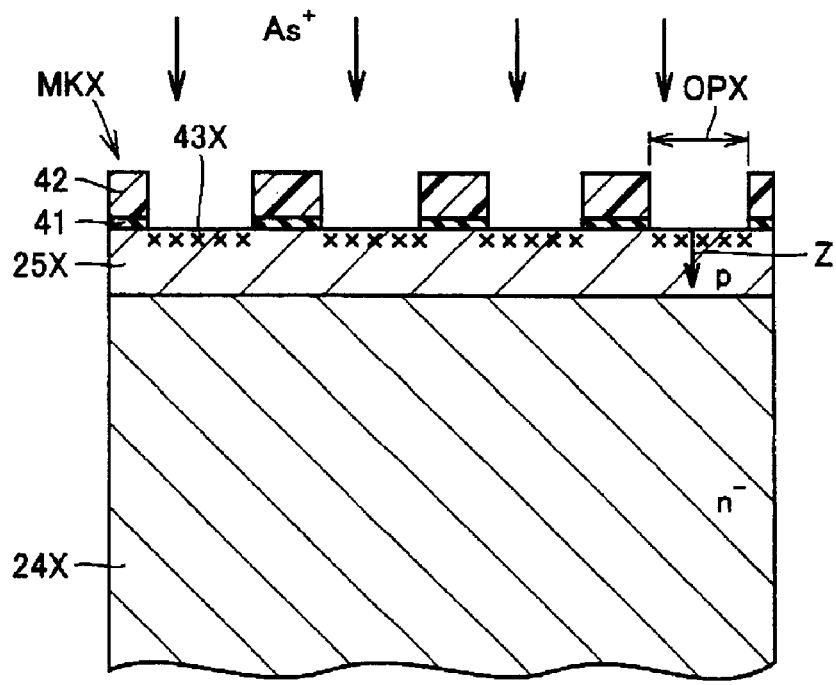
FIG. 8 is a partial cross-sectional view schematically showing a step in a method of manufacturing the semiconductor device according to the second embodiment of the present invention, with regard to a portion to serve as a main current control portion as a first semiconductor element portion.
Figure 9:
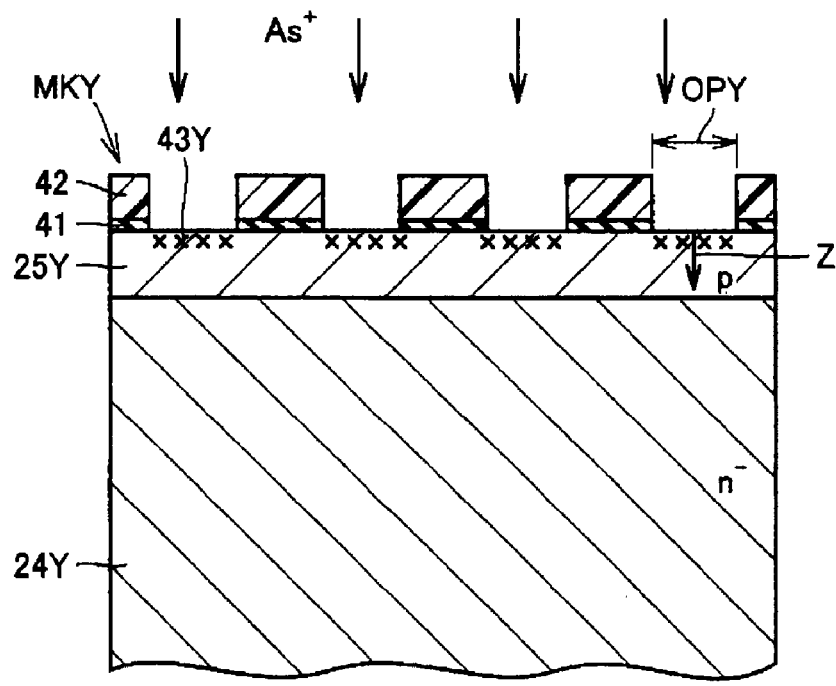
FIG. 9 is a partial cross-sectional view schematically showing a step in the method of manufacturing the semiconductor device according to the second embodiment of the present invention, with regard to a portion to serve as a sense current control portion as a second semiconductor element portion.

Referring to FIGS. 8 and 9, a silicon oxide film 41 is formed on p base layer 25, and a photoresist layer 42 is formed thereon. A photolithography step is successively performed to form a mask constituted of silicon oxide film 41 and photoresist layer 42 on p base layer 25. Specifically, a first mask MKX (FIG. 8) is formed on main p base layer 25X in p base layer 25, and a second mask MKY (FIG. 9) is formed on sense p base layer 25Y in p base layer 25. First and second masks MKX and MKY have openings having a first opening width OPX (FIG. 8) and a second opening width OPY (FIG. 9) in positions where main n+ source portion 29X and sense n+ source portion 29Ya are to be formed, respectively. Second opening width OPY is smaller than first opening width OPX.

Then, arsenic ions are implanted as a conductivity type impurity into main p base layer 25X and sense p base layer 25Y by using first and second masks MKX and MKY, respectively. As a result, first and second ion-implanted portions 43X and 43Y are formed in main p base layer 25X and sense p base layer 25Y, respectively.

An amount of implantation into ion-implanted portion 43Y is smaller than an amount of implantation into ion-implanted portion 43X. This is because second opening width OPY is smaller than first opening width OPX, and because a large amount of outgassing occurs from second mask MKY smaller in opening width than first mask MKX which results in suppression of the amount of ion implantation. Consequently, depth EPa (FIG. 7) of sense n+ source portion 29Ya formed from second ion-implanted portion 43Y is smaller than depth EP (FIG. 3) of main n+ source portion 29X formed from first ion-implanted portion 43X.

Then, main p+ contact portion 30X (FIG. 3) and sense p+ contact portion 30Y (FIG. 7) are formed in p base layer 25 with an ion implantation technique.

Thereafter, main trench TX and sense trench TY are formed to penetrate main n+ source portion 29X and sense n+ source portion 29Y, respectively. Steps similar to those in the first embodiment are subsequently performed, thus obtaining the semiconductor device according to the present embodiment.

Figure 10:
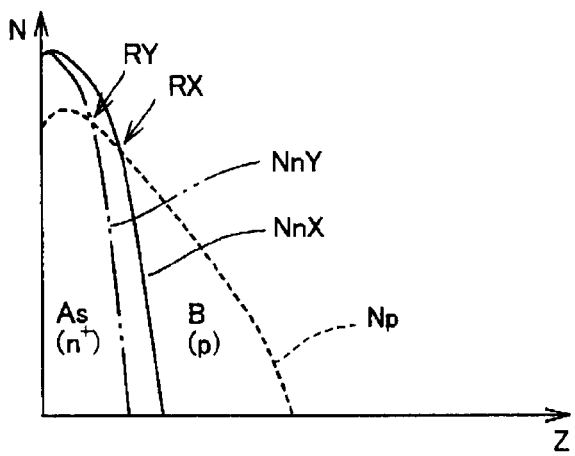
FIG. 10 schematically illustrates impurity concentration profiles in FIGS. 8 and 9.

Referring to FIG. 10, a vertical axis N represents an impurity concentration NnX in main p base layer 25X, an impurity concentration NnY in sense p base layer 25Y, and an impurity concentration Np in p base layer 25 in a direction of a Z-axis in FIGS. 8 and 9. In FIG. 10, arrows RX and RY indicate an intersection of impurity concentration NnX and impurity concentration Np and an intersection of impurity concentration NnY and impurity concentration Np, respectively.

Since the amount of As (arsenic) ion implantation into ion-implanted portion 43Y is smaller than the amount of As ion implantation into ion-implanted portion 43X as described above, a pn junction portion (arrow RY) in sense n+ source portion 29Ya is formed in a shallower position. As a result, sense p base layer 25Y in which sense channel surface PY is formed has higher impurity concentration N on the side of the pn junction portion (arrow RY). Accordingly, $N_a$ in the above expression (1) is increased, thus increasing voltage threshold value $V_{th}$. As such, by making second opening width OPY (FIG. 9) smaller than first opening width OPX (FIG. 8), the voltage threshold value of sense portion SYa (FIG. 7) can be adjusted to be increased.

Based on the principle contrary to the above, by making second opening width OPY (FIG. 9) larger than first opening width OPX (FIG. 8), such adjustment that the voltage threshold value of sense portion SYa (FIG. 7) is lower can also be made.

According to the present embodiment, in addition to making the voltage threshold value of sense portion SY higher than the voltage threshold value of main portion SX with the method described in the first embodiment, a voltage threshold value of at least any of main portion SX and sense portion SY can be adjusted.

(Third Embodiment)

A semiconductor device according to the present embodiment includes a main portion SXb (FIG. 11) and a sense portion SYb (FIG. 12) instead of main portion SX (FIG. 3) and sense portion SY (FIG. 4) in the first embodiment, respectively.

Figure 11:
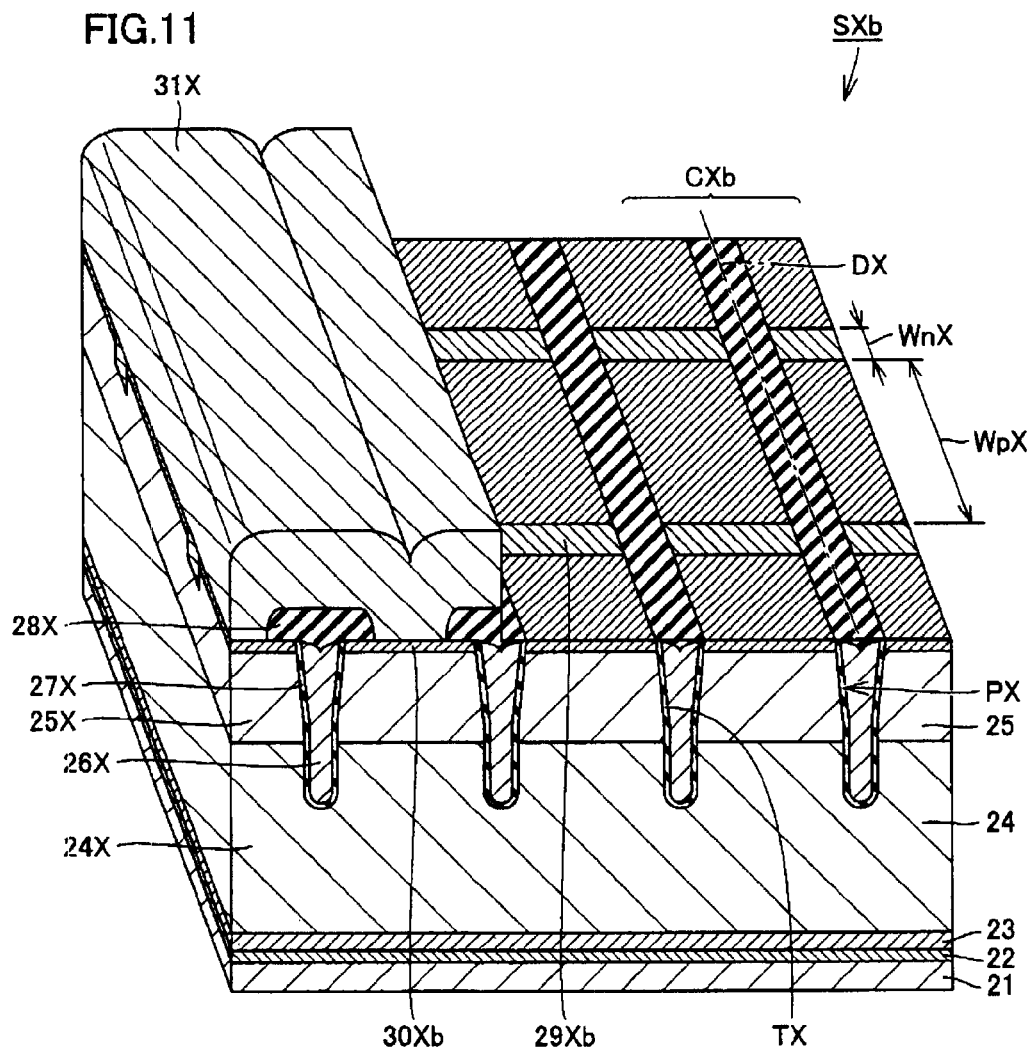
FIG. 11 is a partial cross-sectional perspective view schematically showing a configuration of a main current control portion as a first semiconductor element portion in a semiconductor device according to a third embodiment of the present invention.

Referring to FIG. 11, main portion SXb includes a main cell CXb arranged similarly to main cell CX (FIG. 3). Main portion SXb also includes, instead of main n+ source portion 29X and main p+ contact portion 30X of main portion SX (FIG. 3), a main n+ source portion 29Xb and a main p+ contact portion 30Xb, respectively, for each main cell CXb. Main n+ source portion 29Xb and main p+ contact portion 30Xb are arranged in stripes along main direction DX when viewed two-dimensionally, and constitutes a so-called stripe structure. Main n+ source portion 29Xb and main p+ contact portion 30Xb have a first source width WnX and a first contact width WpX (first width) along main direction DX, respectively. Thus, the plurality of main n+ source portions 29Xb are arranged at intervals of first contact width WpX along main direction DX.

Figure 12:
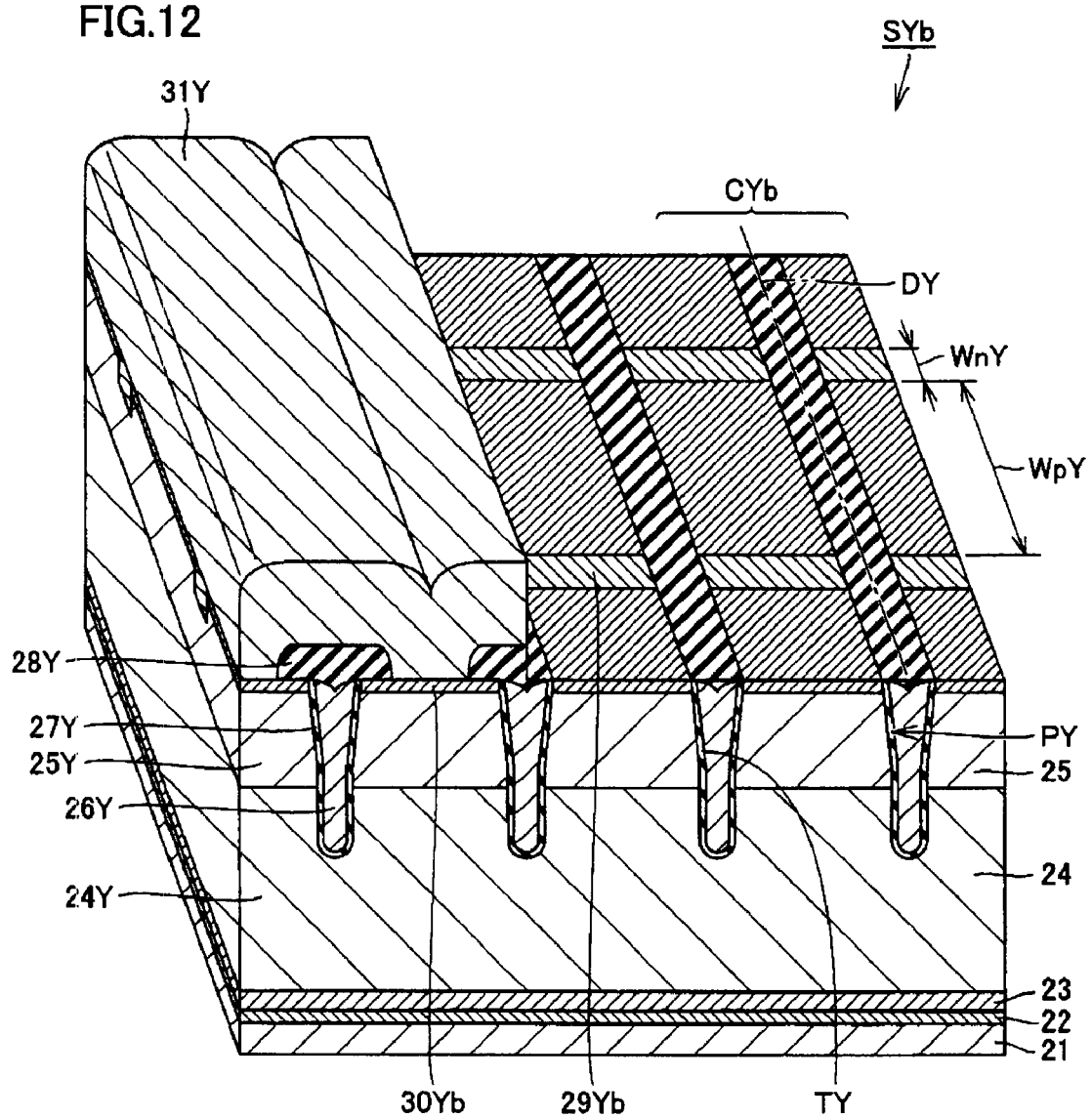
FIG. 12 is a partial cross-sectional perspective view schematically showing a configuration of a sense current control portion as a second semiconductor element portion in the semiconductor device according to the third embodiment of the present invention.

Referring to FIG. 12, sense portion SYb includes a sense cell CYb arranged similarly to sense cell CY (FIG. 4). Sense portion SYb also includes, instead of sense n+ source portion 29Y and sense p+ contact portion 30Y of sense portion SY (FIG. 4), a sense n+ source portion 29Yb and a sense p+ contact portion 30Yb, respectively, for each sense cell CYb. Sense n+ source portion 29Yb and sense p+ contact portion 30Yb are arranged in stripes along sense direction DY when viewed two-dimensionally, and constitutes a so-called stripe structure. Sense n+ source portion 29Yb and sense p+ contact portion 30Yb have a second source width WnY and a second contact width WpY (second width) along sense direction DY, respectively. Thus, the plurality of sense n+ source portions 29Yb are arranged at intervals of second contact width WpY along sense direction DY.

Figure 13:
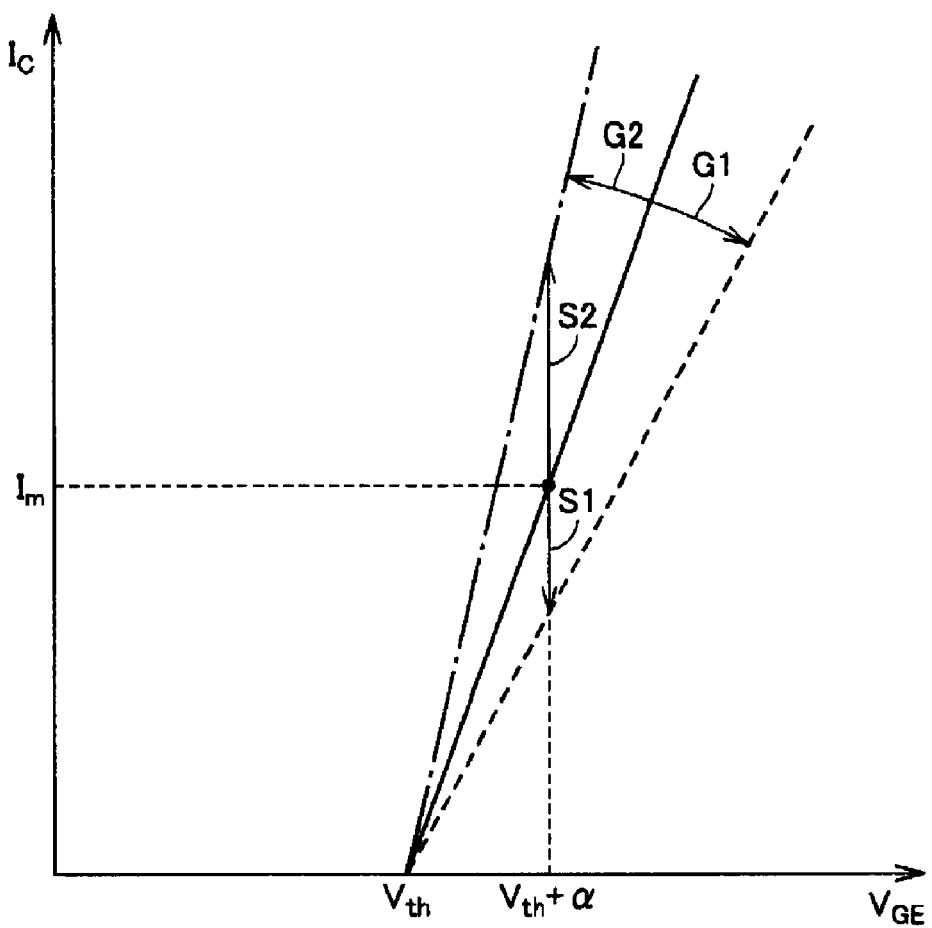
FIG. 13 is a graph illustrating an example where relation between a voltage threshold value and a collector current varies with a dimension of a source width in the semiconductor element portions in FIGS. 11 and 12.

Referring to FIG. 13, in sense portion SYb, a gate voltage $V_{GE}$ and sense current IY (FIG. 1), i.e., a collector current $I_C$, has such a proportional relation that collector current $I_C$ rises from voltage threshold value $V_{th}$ and increases in proportion to $V_{GE}$. A slope in this proportional relation becomes gentler as indicated by an arrow G1 when a ratio of second source width WnY to second contact width WpY is reduced, and becomes steeper as indicated by an arrow G2 when the ratio of second source width WnY to second contact width WpY is increased. A collector current $I_m$ when a voltage $V_{th}+\alpha$ exceeding voltage threshold value $V_{th}$ is being applied as gate voltage $V_{GE}$ decreases as indicated by an arrow S1 when the slope becomes gentler as indicated by arrow G1, and increases as indicated by an arrow S2 when the slope becomes steeper as indicated by arrow G2.

According to the present embodiment, adjustment of the ratio of second source width WnY to second contact width WpY allows adjustment of the slope of collector current $I_C$ as indicated by arrow G1 or G2, thereby adjusting a value of sense current IY (FIG. 1).

When the slope becomes gentler as indicated by arrow G1, an SOA (Safe Operating Area) characteristic in consideration of operation of a parasitic bipolar transistor can be improved.

Furthermore, adjustment of a ratio of first source width WnX to first contact width WpX allows adjustment of the slope of collector current $I_C$ as indicated by arrow G1 or G2, thereby adjusting a value of main current IX (FIG. 1).

As a variation of the present embodiment, a configuration including main portion SX (first embodiment) instead of main portion SXb may be used.

(Fourth Embodiment)

A semiconductor device according to the present embodiment includes a main portion SXc (FIG. 14) and a sense portion SYc (FIG. 15) instead of main portion SX (FIG. 3) and sense portion SY (FIG. 4) in the first embodiment, respectively.

Figure 14:
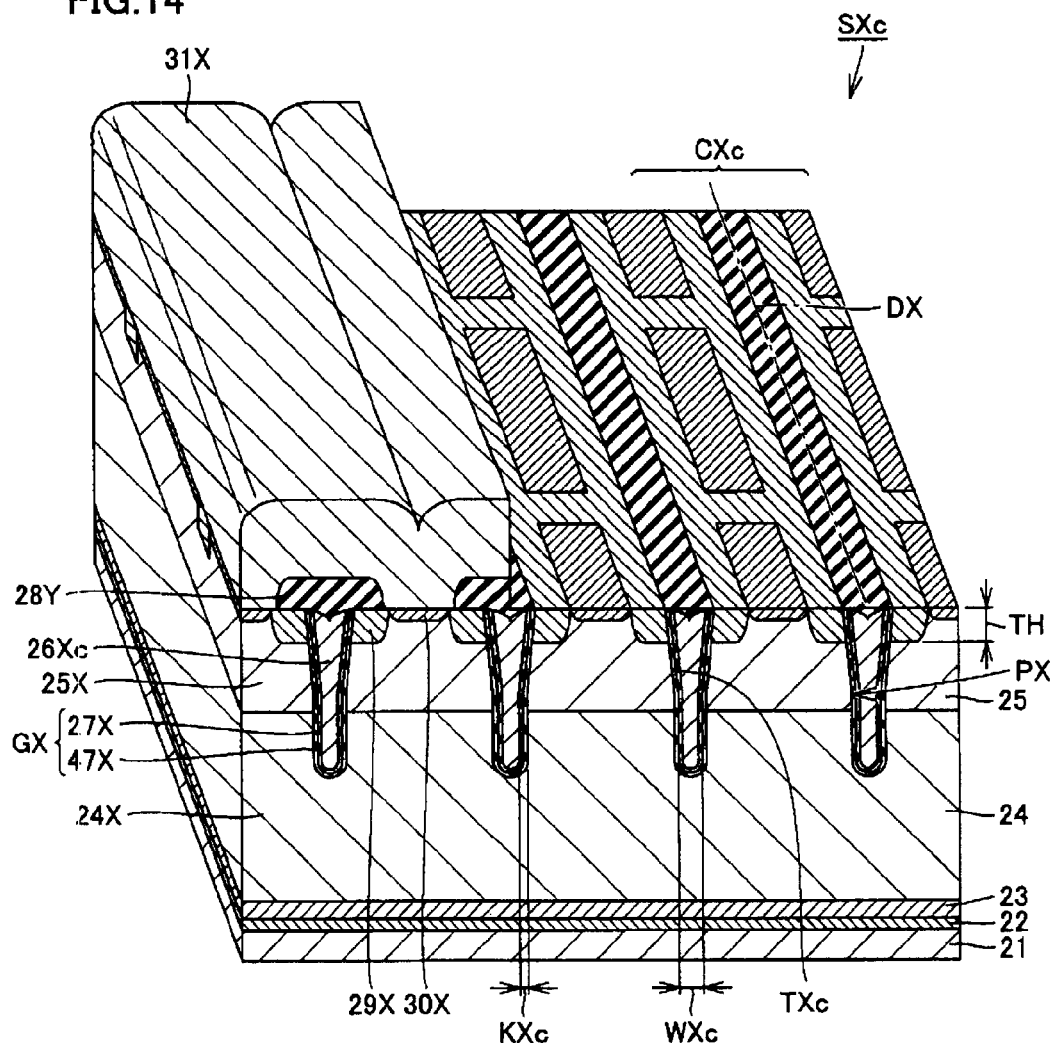
FIG. 14 is a partial cross-sectional perspective view schematically showing a configuration of a main current control portion as a first semiconductor element portion in a semiconductor device according to a fourth embodiment of the present invention.

Referring mainly to FIG. 14, main portion SXc includes a main cell CXc arranged similarly to main cell CX (FIG. 3), and a main trench TXc arranged similarly to main trench TX (FIG. 3). As in the first embodiment, main gate insulating film 27X is provided to cover main trench TXc. Main trench TXc covered with main gate insulating film 27X has a first covered trench width WXc smaller than an original trench width of main trench TXc due to the thickness of main gate insulating film 27X.

Main portion SXc further includes a main CVD oxide film 47X (third gate insulating film) covering main gate insulating film 27X for each main cell CXc. That is, main portion SXc includes main CVD oxide film 47X provided between main gate insulating film 27X and main gate electrode 26Xc. Main CVD oxide film 47X constitutes a stacked main gate insulating film GX together with main gate insulating film 27X. Stacked main gate insulating film GX has a first stacked thickness KXc, which is the sum of the thickness of main gate insulating film 27X and a thickness of main CVD oxide film 47X.

Figure 15:
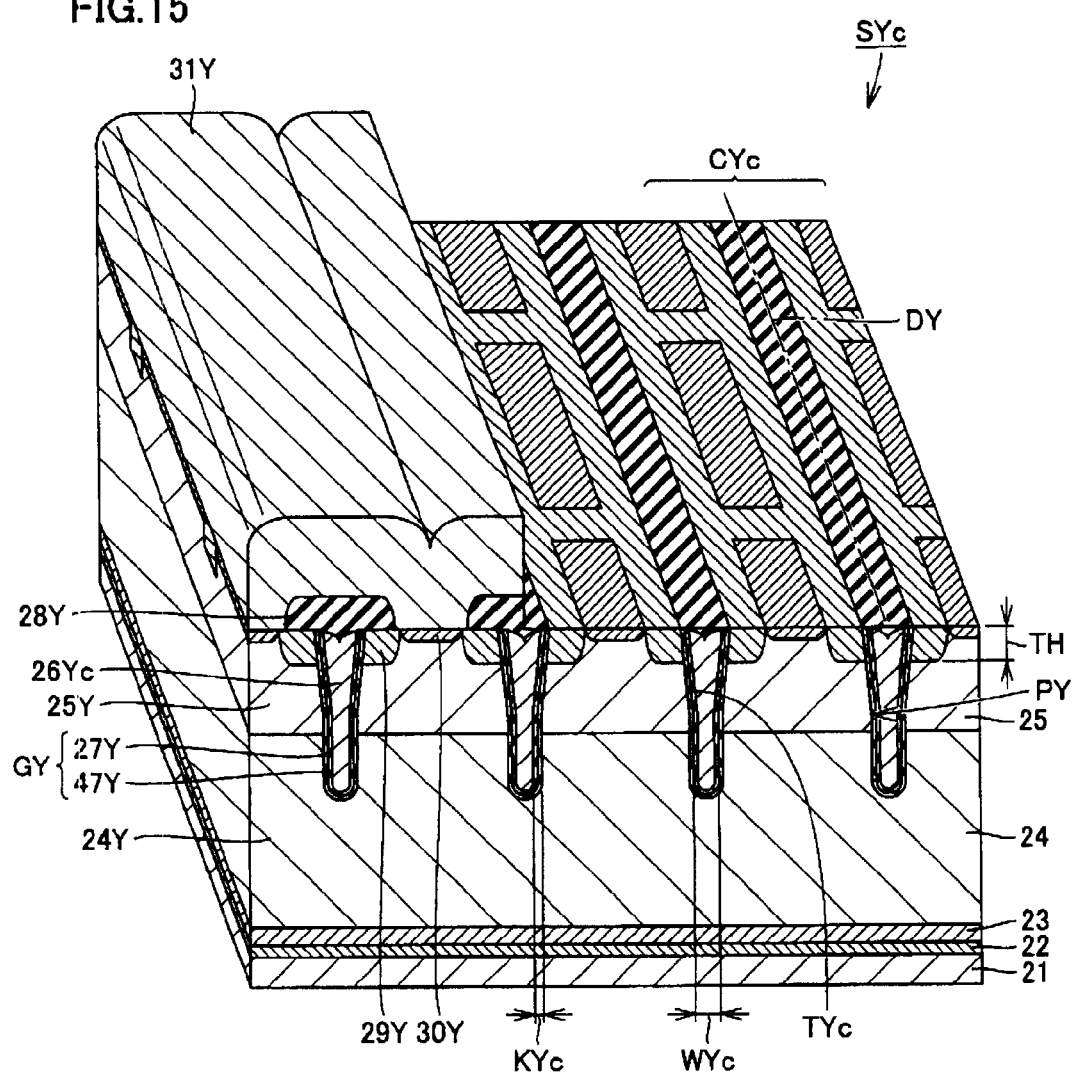
FIG. 15 is a partial cross-sectional perspective view schematically showing a configuration of a sense current control portion as a second semiconductor element portion in the semiconductor device according to the fourth embodiment of the present invention.

Referring mainly to FIG. 15, sense portion SYc includes a sense cell CYc arranged similarly to sense cell CY (FIG. 4) and a sense trench TYc arranged similarly to sense trench TY (FIG. 4). As in the first embodiment, sense gate insulating film 27Y is provided to cover sense trench TYc. Sense trench TYc covered with sense gate insulating film 27Y has a second covered trench width WYc smaller than an original trench width of sense trench TYc due to the thickness of sense gate insulating film 27Y. In the present embodiment, second covered trench width WYc is larger than first covered trench width WXc.

Sense portion SYc further includes a sense CVD oxide film 47Y (fourth gate insulating film) covering sense gate insulating film 27Y for each sense cell CYc. That is, sense portion SYc includes sense CVD oxide film 47Y provided between sense gate insulating film 27Y and sense gate electrode 26Yc. Sense CVD oxide film 47Y constitutes a stacked sense gate insulating film GY together with sense gate insulating film 27Y. Stacked sense gate insulating film GY has a second stacked thickness KYc, which is the sum of the thickness of sense gate insulating film 27Y and a thickness of sense CVD oxide film 47Y.

Next, a method of manufacturing the semiconductor device according to the present embodiment is described.

First, main trench TXc and sense trench TYc are formed in a manner similar to that of main trench TX and sense trench TY in the first embodiment. Then, main gate insulating film 27X and sense gate insulating film 27Y are formed as in the first embodiment. Here, by appropriately selecting a trench width of main trench TXc and sense trench TYc, second covered trench width WYc is made larger than first covered trench width WXc.

Thereafter, main CVD oxide film 47X and sense CVD oxide film 47Y covering main gate insulating film 27X and sense gate insulating film 27Y, respectively, are simultaneously formed with CVD (Chemical Vapor Deposition). Main CVD oxide film 47X and sense CVD oxide film 47Y are deposited in spaces having first covered trench width WXc and second covered trench width WYc, respectively, with second covered trench width WYc being larger than first covered trench width WXc. Accordingly, a CVD material gas is introduced in the space where sense CVD oxide film 47Y is to be formed in an amount greater than in the space where main CVD oxide film 47X is to be formed. As a result, the thickness of sense CVD oxide film 47Y is larger than the thickness of main CVD oxide film 47X.

Steps similar to those in the first embodiment are subsequently performed, thus obtaining the semiconductor device according to the present embodiment.

Next, a function and effect of the present embodiment is described.

Between the step of forming main trench TXc (FIG. 14) and sense trench TYc (FIG. 15) and the step of forming main gate insulating film 27X and sense gate insulating film 27Y, a foreign object may adhere onto main trench TXc or sense trench TYc. The foreign object affects the chemical combination reaction such as thermal oxidation for forming main gate insulating film 27X and sense gate insulating film 27Y, which may cause a defect in main gate insulating film 27X or sense gate insulating film 27Y. Main CVD oxide film 47X and sense CVD oxide film 47Y formed on such defective main gate insulating film 27X and sense gate insulating film 27Y are formed with CVD, and are therefore formed substantially uniformly without being particularly affected by the foreign object. The defect is thus covered, thereby suppressing occurrence of a short-circuit in the gate insulating films resulting from the defect.

In addition, since second covered trench width WYc is made larger than first covered trench width WXc, the thickness of sense CVD oxide film 47Y is larger than the thickness of main CVD oxide film 47X. Accordingly, second stacked thickness KYc can be made larger than first stacked thickness KXc, thereby making the voltage threshold value of sense portion SYc higher than the voltage threshold value of main portion SXc. Therefore, the difference in voltage threshold value between main portion SXc and sense portion SYc can be adjusted to be increased.

Although second covered trench width WYc was made larger than first covered trench width WXc in the present embodiment, conversely, second covered trench width WYc may be made smaller than first covered trench width WXc. In this case, the difference in voltage threshold value between main portion SXc and sense portion SYc can be adjusted to be reduced.

Alternatively, first covered trench width WXc and second covered trench width WYc may be equal to each other. In this case, the voltage threshold values of main portion SXc and sense portion SYc are adjusted to increase by substantially the same amount.

As a configuration of the semiconductor device according to the present invention, a configuration in which the conductivity types are reversed, i.e., a configuration in which a p-type and an n-type are reversed, in each of the embodiments may be used.

Although an IGBT portion is provided in each of the embodiments described above, the IGBT portion may be replaced by other semiconductor element portions such as a MISFET (Metal Insulator Semiconductor Field-Effect Transistor) portion, e.g., a MOSFET (Metal Oxide Semiconductor Field-Effect Transistor). In this case, for example, a structure without collector layer 22 in each of the embodiments described above may be used.

In addition, the first and second plane orientations are not limited to (001) and (011), respectively.

Moreover, the "rectangular shape" herein is understood to include a square shape.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device including a semiconductor layer having a single-crystalline structure, comprising:
a first semiconductor element portion including a first channel surface having a first plane orientation, for switching a first current,
said first semiconductor element portion including
a first region of said semiconductor layer including a first trench having said first channel surface,
a first gate insulating film covering said first channel surface with a first thickness, and
a first gate electrode provided on said first gate insulating film to fill said first trench, for applying an electric field to said first channel surface; and
a second semiconductor element portion including a second channel surface having a second plane orientation different from said first plane orientation, for switching a second current smaller than said first current,
said second semiconductor element portion including
a second region of said semiconductor layer including a second trench having said second channel surface,
a second gate insulating film covering said second channel surface with a second thickness larger than said first thickness, and
a second gate electrode provided on said second gate insulating film to fill said second trench, for applying an electric field to said second channel surface.

2. The semiconductor device according to claim 1, wherein each of said first and second gate insulating films is made of a material obtained by chemical combination reaction of a material for said semiconductor layer, and
the material for said semiconductor layer has such a property that a rate of progress of said chemical combination reaction in said second plane orientation is faster than a rate of progress of said chemical combination reaction in said first plane orientation.

3. The semiconductor device according to claim 2, wherein said chemical combination reaction is oxidation reaction.

4. The semiconductor device according to claim 1, wherein said semiconductor layer has a first conductivity type, and said semiconductor device further comprises a first source portion having a second conductivity type different from said first conductivity type and formed in said first region to a first depth, and a second source portion having said second conductivity type and formed in said second region to a second depth different from said first depth.

5. The semiconductor device according to claim 1, wherein said semiconductor layer has a first conductivity type, and said semiconductor device further comprises a plurality of second source portions having a second conductivity type different from said first conductivity type and formed in said second region such that each of said plurality of second source portions has a second source width along a second direction in which said second trench extends when viewed two-dimensionally, said plurality of second source portions being arranged at intervals of a second width along said second direction.

6. The semiconductor device according to claim 1, wherein said first semiconductor element portion includes a third gate insulating film provided between said first gate insulating film and said first gate electrode, and
said second semiconductor element portion includes a fourth gate insulating film provided between said second gate insulating film and said second gate electrode.

7. The semiconductor device according to claim 1, wherein said first trench covered with said first gate insulating film has a first covered trench width, said second trench covered with said second gate insulating film has a second covered trench width, and said first and second covered trench widths are different from each other.

* * * * *